United States Patent [19]

Pickles et al.

[11] Patent Number: 5,026,292
[45] Date of Patent: Jun. 25, 1991

[54] CARD EDGE CONNECTOR

[75] Inventors: Charles S. Pickles, Hummelstown; Matthew M. Sucheski, Harrisburg; Mark R. Thumma, Oberlin, all of Pa.

[73] Assignee: AMP Incorporated, Harrisburg, Pa.

[21] Appl. No.: 458,071

[22] Filed: Jan. 10, 1990

[51] Int. Cl.$^5$ ...................... H01R 13/652; H01R 9/09
[52] U.S. Cl. ..................................... 439/108; 439/636
[58] Field of Search ................. 439/92, 101, 108, 924, 439/636, 637, 59, 62, 65, 79

[56] References Cited

U.S. PATENT DOCUMENTS

| | | | |
|---|---|---|---|
| 3,399,372 | 8/1968 | Uberbacher | 439/60 |
| 3,744,005 | 7/1973 | Sitzler | 439/637 |
| 4,659,155 | 4/1987 | Walkup et al. | 439/108 |
| 4,806,103 | 2/1989 | Kniese et al. | 439/636 |
| 4,806,110 | 2/1989 | Lindeman | 439/108 |
| 4,824,384 | 4/1989 | Nicholas et al. | 439/108 |

FOREIGN PATENT DOCUMENTS

| | | | |
|---|---|---|---|
| 1170256 | 11/1969 | United Kingdom | 439/637 |
| 1400605 | 7/1975 | United Kingdom | 439/92 |

OTHER PUBLICATIONS

IBM Technical Disclosure Bulletin, "Ground Plane Interposer", vol. 21, No. 3, Aug. 1978, p. 955.

*Primary Examiner*—Gary F. Paumen
*Attorney, Agent, or Firm*—Katherine A. Nelson

[57] ABSTRACT

A card edge electrical connector 10 includes a dielectric housing member 12, a card receiving cavity 30, a plurality of contacts including signal contact members 36, 36a arranged in opposed pairs along opposite sides of the card receiving cavity 30 and ground contact member 54 associated with each pair of signal contact members 36, 36a. Each signal contact member 36, 36a has a first contact section 44 for engaging corresponding signal traces 84 on the daughter card 72 and second contact sections 52, 52a respectively exposed along the mounting face 18 of the housing 12 and adapted to be engaged to corresponding signal contact means 92 of another electrical article 86. A ground contact member 54 is mounted into the housing 12 at each contact location and includes ground contact sections 62 engageable with ground contact means 80 of card 72 upon full card insertion. The ground contact member 54 include second ground contact sections 70 exposed along the mounting face 18 of the housing 12 and engageable with corresponding ground contacts 96 of the electrical article 86.

5 Claims, 7 Drawing Sheets

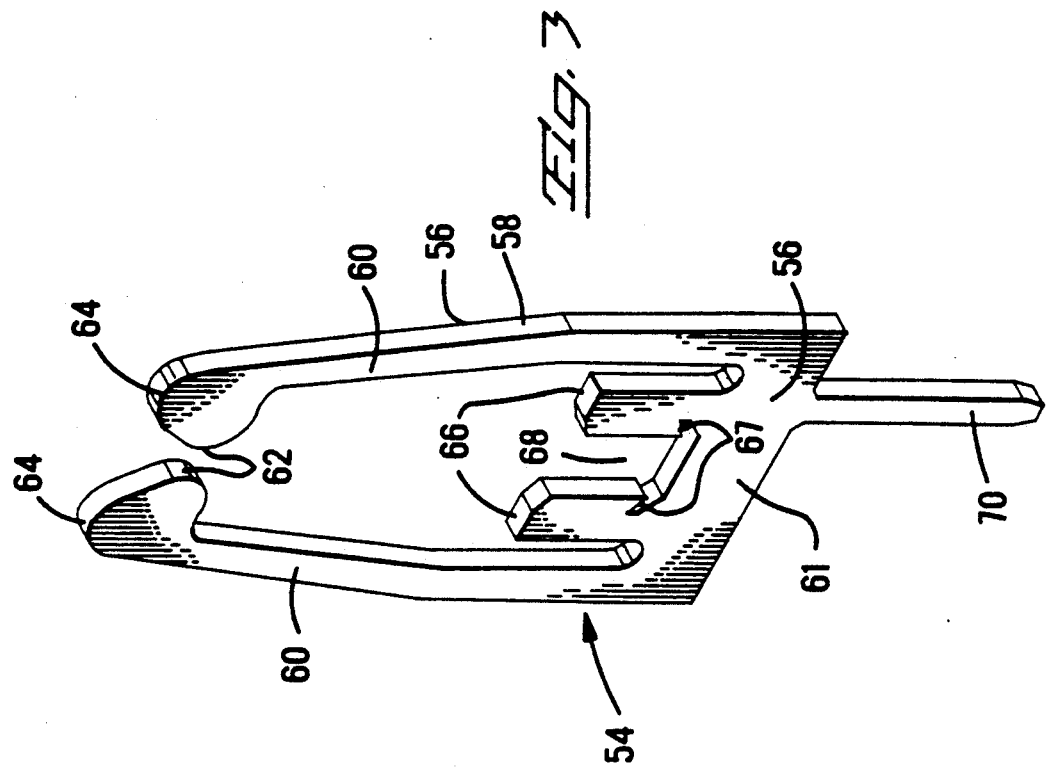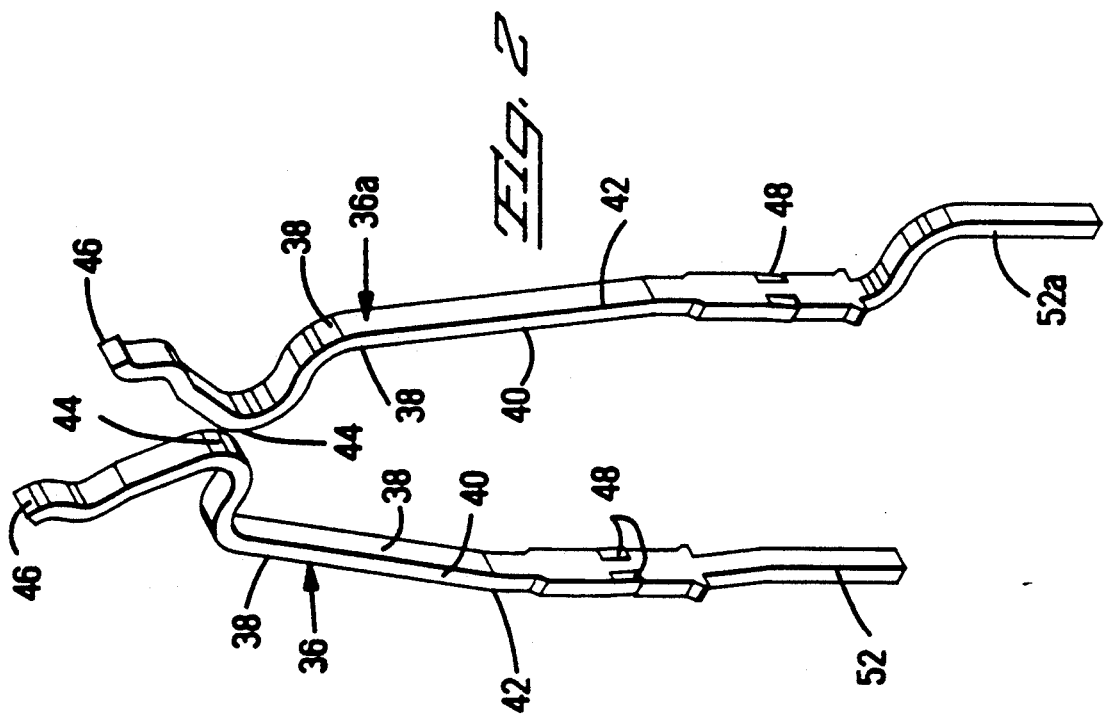

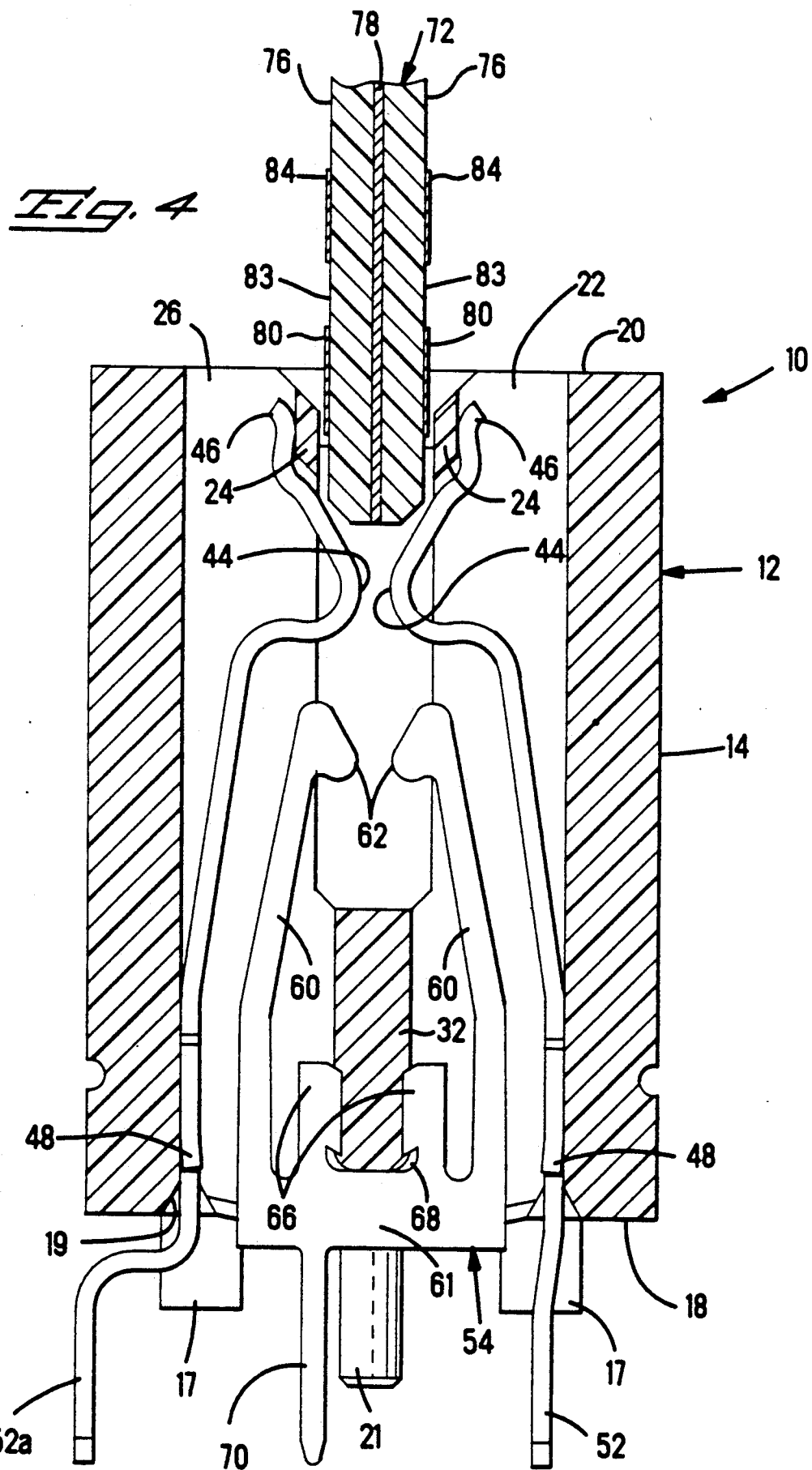

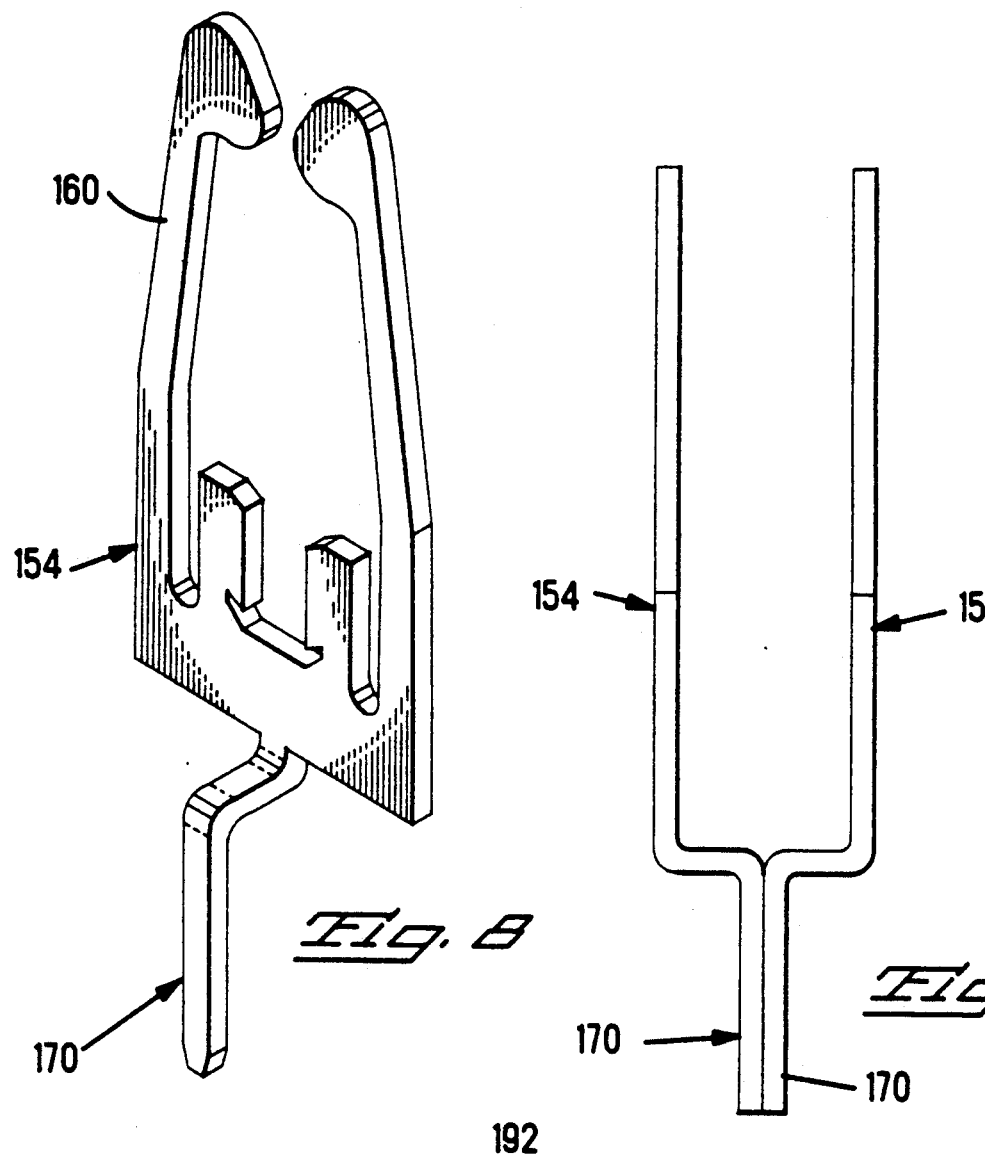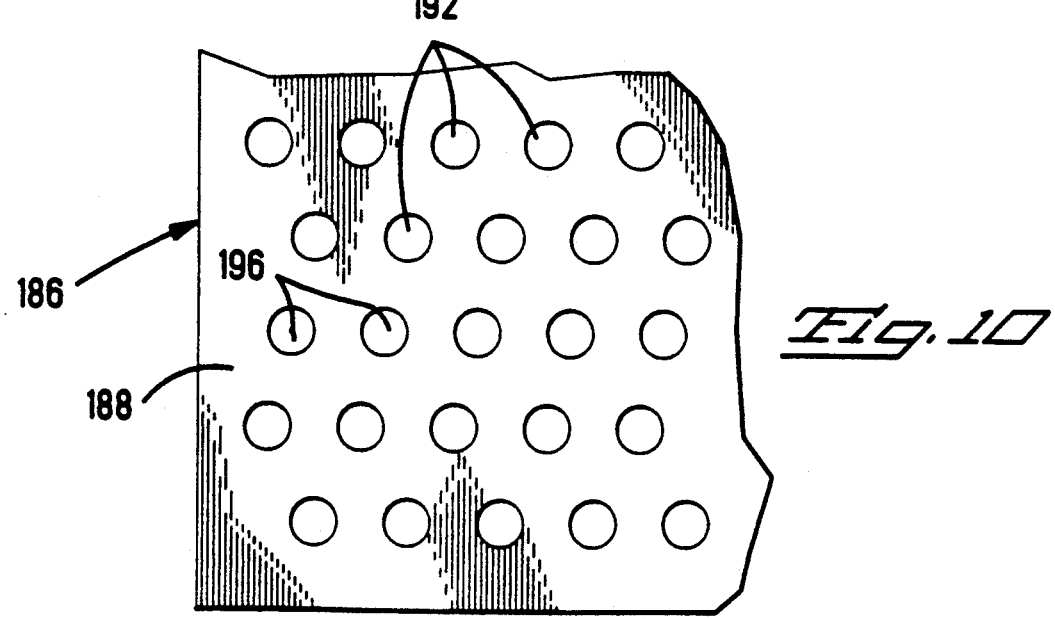

CARD EDGE CONNECTOR

FIELD OF THE INVENTION

The present invention is related to card edge connectors and more particularly to high-speed card edge connectors.

BACKGROUND OF THE INVENTION

The needs of today's electronic industry require higher speed electronic equipment such as computers and the like. Since many of the electrical interconnections within this type of equipment use circuit boards, it is desirable to provide high-speed card edge connectors having a controlled impedance that will essentially match the impedance of the circuit boards. A high-speed connector is one that can pass fast rise time signals without distorting or degrading that rise time. It is desirable, therefore, to control the impedance of the connector to reduce signal reflection caused by changes in impedance in the pathways conducting the digital pulse. Impedance control requires close spacing of ground and signal traces and interconnections. With the closer spacing of the conductors, it is also necessary to prevent cross talk between adjacent conductors.

U.S. Pat. No. 4,659,155 discloses a two-piece daughter board-backplane connector having an internal connector for use with a circuit board having internal ground plane layer. The daughter board element is connected to a multilayer impedance controlled daughter board having internal ground layers and signal conductors on opposed surfaces. The signal contacts on the board are electrically engaged with rows of signal contacts disposed on opposite sides of the daughter board. The ground contacts are mounted between dielectric portions of the connector element and overlap a plurality of signal contacts on a backplane connector element. The ground contacts overlap a plurality of adjacent signal contacts. The daughter board connector includes a plurality of receptacles for receiving pin members on the backplane element. One disadvantage of the above connector is that it is a two-piece assembly that requires a considerable amount of space to accommodate all of the components of the assembly. Furthermore the connector has a number of different parts, which require a number of manufacturing steps to produce the assembly, thereby increasing the cost of the finished product. It is desirable therefore to provide a means for assuring a ground contact closely associated with signal connections in a compact and cost effective one-piece connector.

U.S. Pat. No. 3,399,372 discloses a high density connector package having a plurality of signal and ground contacts arranged in an alternating array such that each signal contact is associated with a ground contact. In the disclosed embodiment, the signal contacts are small wire members and the ground contacts are metal sheet members thereby providing for close stacking of the signal and ground pairs. The disadvantage of the alternating contact type of system is that for signal contacts to be maintained at a given center line spacing, the dimensions of the various internal members of the assembly must be "scaled down" to provide for "double density", that is that two adjacent contacts must be accommodated in the space previously occupied by a single contact member.

SUMMARY OF THE INVENTION

Accordingly, the present invention is directed to an electrical connector that alleviates the disadvantages and deficiencies of the prior art by providing a means for assuring a ground connection associated with each signal connection at each location of a pair of signal contacts and between the signal contact members of each pair.

In accordance with the present invention an electrical connector for use with circuit boards of the type having ground contact means disposed along the leading edge thereof and signal traces located rearwardly from the ground contact means comprises a dielectric housing member having a plurality of contact locations spaced laterally along a card receiving cavity extending therein, a pair of opposed signal contact members and a discrete ground contact member disposed between the opposed contact members at each contact location of the connector. The signal contact members have contact sections for engaging respective opposed traces on opposite major surfaces of a card inserted therebetween, the contact sections being defined on free ends of cantilevered beams which extend into the cavity and are deflected outwardly by the card upon card insertion therebetween. Upon full insertion of the card the contact sections become engaged with the respective contact sections on the circuit board. At each contact location a ground contact member having a first contact section comprising a pair of opposed cantilevered beams also extends into the card receiving cavity. The beams include contact sections thereon engageable with the ground contact means on opposed sides of the card upon full insertion therebetween. The card edge connector of the present invention provides an assured ground connection associated with each signal connection and at each location of the signal contact pairs.

It is an object of the invention to provide a one-piece grounded high-speed connector.

It is another object of the invention to provide a high-speed connector that will fit within the same geometric spacing as existing card edge connectors while maintaining the same number of signal contacts on the same centerlines as standard card edge connectors.

It is a further object of the invention to provide a one-piece controlled impedance card edge connector.

It is also an object of the invention to provide a cost effective means for making a one-piece high-speed electrical connector.

It is a still further object of the present invention to provide a signal and ground pair at each contact position.

It is an additional object of the invention to provide a short electrical ground or reference path between the daughter board and the mother board or backplane.

Some of the objects and advantages of the invention having been stated, others will appear as the description proceeds when taken in connection with the accompanying drawing.

BRIEF DESCRIPTION OF THE DRAWING

FIG. 2 is a perspective view of a pair of signal contact members made in accordance with the invention;

FIG. 3 is a perspective view of the ground contact member made in accordance with the invention;

FIGS. 4 through 7 are cross-sectional views of the connector of FIG. 1 sequentially illustrating the process of inserting the daughter card between the signal and ground contact members of the present invention;

FIG. 8 is a perspective view of an alternative embodiment for the ground contact member;

FIG. 9 is a side view of two of the ground contact members of FIG. 8 having the corresponding second contact sections of the terminal members extending along side each other for insertion into a common through-hole in the mother board or backplane; and FIG. 10 illustrates an alternative embodiment of the backplane for use with the alternative terminal member of FIG. 8.

DETAILED DESCRIPTION OF THE DRAWING

Figure 1:
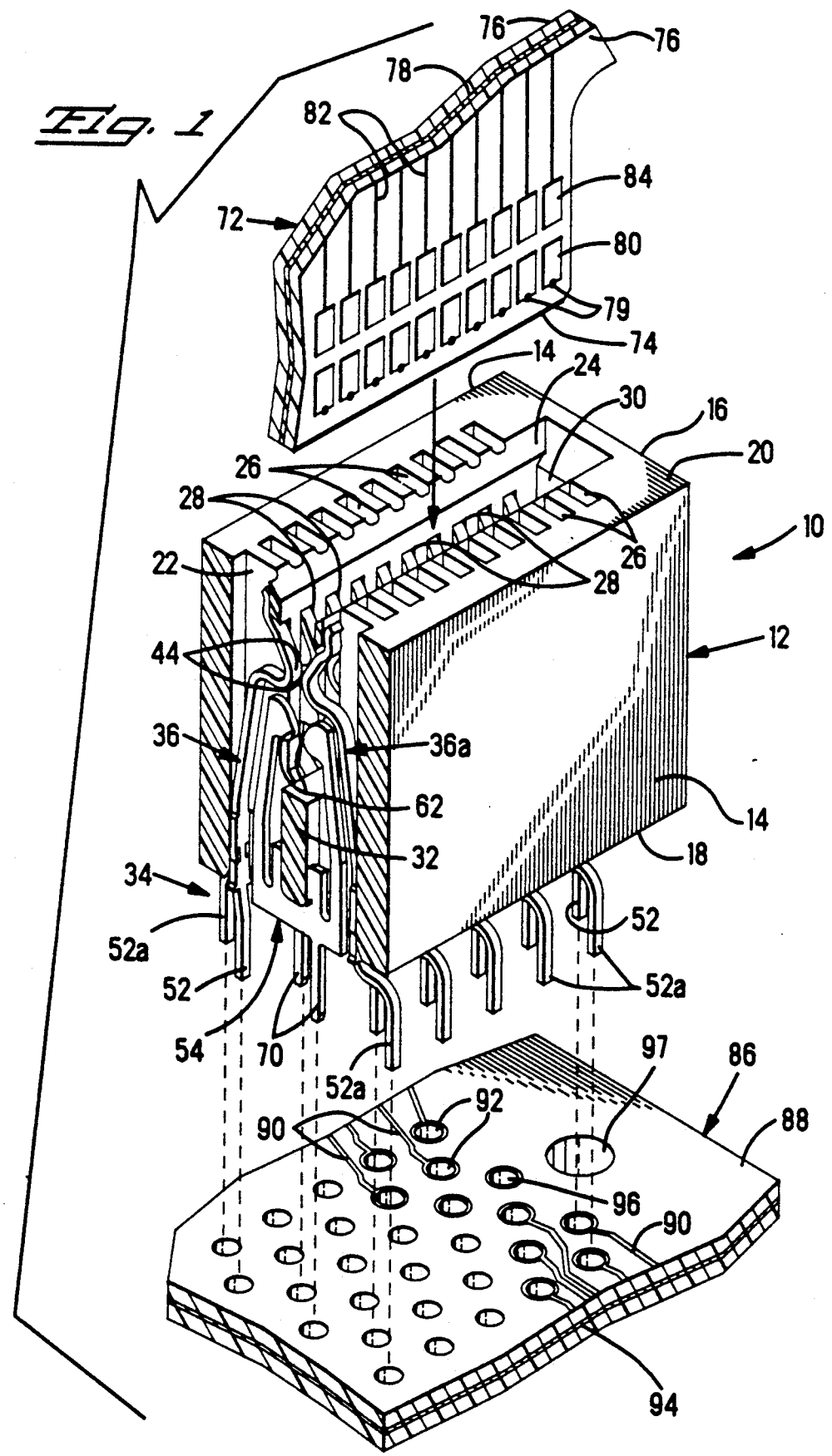
FIG. 1 is an exploded fragmentary perspective view of the connector of the invention mating a daughter board and a backplane.

FIG. 1 shows an electrical connector 10 comprising a dielectric housing member 12 having opposed arrays of contact receiving passageways 26 extending therethrough, a plurality of contacts 34 disposed in respective passageways 26 and a card receiving cavity 30 extending laterally between the opposed arrays of passageways 26 for receiving a card member 72. Dielectric housing member 12 has opposed side walls 14, end walls 16, mounting face 18 and card receiving face 20. An array of contact receiving passageways 26 is defined along side walls 14 of housing 12 for receiving respective signal contact members 36, 36A and ground contact members 54 therein. Adjacent contact receiving passageways 26 in respective arrays are separated by internal wall portions 22, the inner edges 24 of which define card receiving cavity 30. Respective arrays of signal contact locations 28 extend along the upper part of card receiving cavity 30, a signal location 28 being associated with each one of the contact receiving passageways 26. Housing 12 further includes an lower web or wall 32 extending longitudinally between opposed end walls 16 (only one of which is shown), the upper surface of wall 32 defining the lower end of card receiving cavity 30.

As shown in FIG. 1 and FIGS. 4 through 7 a pair of opposed signal contact members 36, 36a and a single ground contact 54 are disposed within each of the contact receiving cavities 26. As best seen in FIG. 2, the opposed pair of signal contact members 36, 36a include cantilevered beam portions 42, each having opposed major surfaces 38 and edges 40. Corresponding first contact sections 44 are adjacent free ends 46 of respective signal contact members 36, 36a. The signal contact members 36, 36a further include respective second contact sections 52 and 52a, which extend from respective other ends of signal contact members 36, 36a and extend through the mounting face 18 of the housing 12. For purposes of illustration, the surrounding portions of housing 12 have been eliminated from FIG. 2 and the pair of signal contact members 36, 36a are shown in the same prestressed position as the contact members 36, 36a of FIG. 1.

As shown in these Figures, the two styles of signal contact members 36, 36a differ only in the shape of the second contact sections 52, 52a and are arranged alternately in the respective cavities 26 of housing 12 to provide a staggered arrangement of the second contact sections 52, 52a extending from mounting face 18 of housing 12. As best seen in FIG. 1, this provides a staggered array of second contact sections 52, 52a for electrically engaging a corresponding staggered array of signal through-holes 92 in backplane 86. The pair of contact members 36, 36a are shown in one arrangement in FIG. 1 and in the other arrangement in FIGS. 4 through 7. Signal contact members 36, 36a further include outwardly extending locking lances 48 adjacent the second contact section 52, 52a, lances 48 being adapted to cooperate with wall portions (not shown) within the housing 12 to secure the signal contact members 36, 36a therein. As shown in FIG. 1 and 4 through 7, the free ends 44 of opposed contact beams 42 lie adjacent a portion of the internal wall 24 forming the contact receiving card receiving cavity 30 and are held in a prestressed position thereagainst.

Ground contact member 54 is generally a U-shaped member having opposed major surfaces 56, edges 58 and cantilevered beams 60 extending upwardly from bight section 61. Cantilevered beams 60 have first contact sections 62 at opposed free ends 64 thereof. Ground contact member 54 further includes a pair of projections 66 extending upwardly from bight section 61 and defining slot 68 therebetween. When ground contact member 54 is received in the housing 12 as shown in FIG. 1 and FIGS. 4 through 7, internal wall 32 is received within slot 68 thereby holding ground contact member 54 in position. The arrangement of the signal contact pair and ground contact member in the same contact receiving passageway more typically occupied only by a signal contact pair, enables the centerline spacing of the signal contact members to be maintained while achieving the advantages of the signal-ground contact combination. These advantages are achieved without the need to provide extra contact receiving passageways or affecting the mechanical tolerances within the housing member, as required in those connectors having additional passageways and "scaled-down" contact members. For example, in a high-speed card connector made in accordance with the present invention signal contact pairs and a ground contact member on a 0.050 inch centerline spacing will occupy the same geometric space as an existing 0.050 inch centerline card edge connector. The contact arrangement of the present invention also facilitates the making of high-speed connectors having signal and contact members on other centerline spacing such as 0.025 and smaller.

In the embodiment shown in FIG. 3, second contact section 70 extends from bight section 61 and is offset from the center thereof. As is seen in FIGS. 1 and 4 through 7 the ground contact member 54 is placed in housing 12 in one of two positions such that the edge 58 of the ground contact member 54 nearer the second contact section 70 is adjacent signal contact member 36a. The ground contact member 54, therefore, is also reversed in adjacent cavities 26 as best seen in FIG. 1 to provide a staggered array of second ground contact sections 70 for insertion into a staggered array of ground through-holes 94 on back plane or mother board 86. FIGS. 4 through 7 also show housing housing stand-offs 17, which hold connector 10 away from the surface of mother board 86, thereby facilitating soldering of the contact members, as is known in the art. FIGS. 4 through 7 also show aligning leg 21, which extends from the mounting face 18 of housing 12 and is inserted in aperture 97 (shown in FIG. 1) to align connector 10 in the proper orientation on board 86. Typically there are at least two alignment legs per connector. For purposes of illustrating the invention, the second contact sections 52, 52a of the signal contact members 36, 36a and ground contact member 54 are shown as pin members that are received into respective signal and ground through-holes 92, 96 respectively of a backplane member 86. It is to be understood that the configuration of the second contact section of the respective contact members may have other configurations such as for example socket contacts for receiving pin members.

Electrical connector 10 is designed for use with a daughter card 72 of the type having ground contact means 80 disposed on opposed major surfaces 76 of card 72 and along a leading edge 74 thereof and proximate thereto and signal traces 82 having signal contact means 84 located rearwardly from the ground contact means 80 on opposed major surfaces 76. In high-speed electrical applications, it is desirable to establish and maintain electrically stable reference or ground potential through the system including through the daughter card, connector and the mother board or back plane. In the embodiment shown, card 72 includes ground plane layer 78 disposed between dielectric layers and back plane 86 includes ground plane 94 disposed between dielectric layers. FIG. 1 shows the plated via-holes 79 interconnecting ground plane 78 to ground contact means 80 of the surface of card 72.

Figure 5:
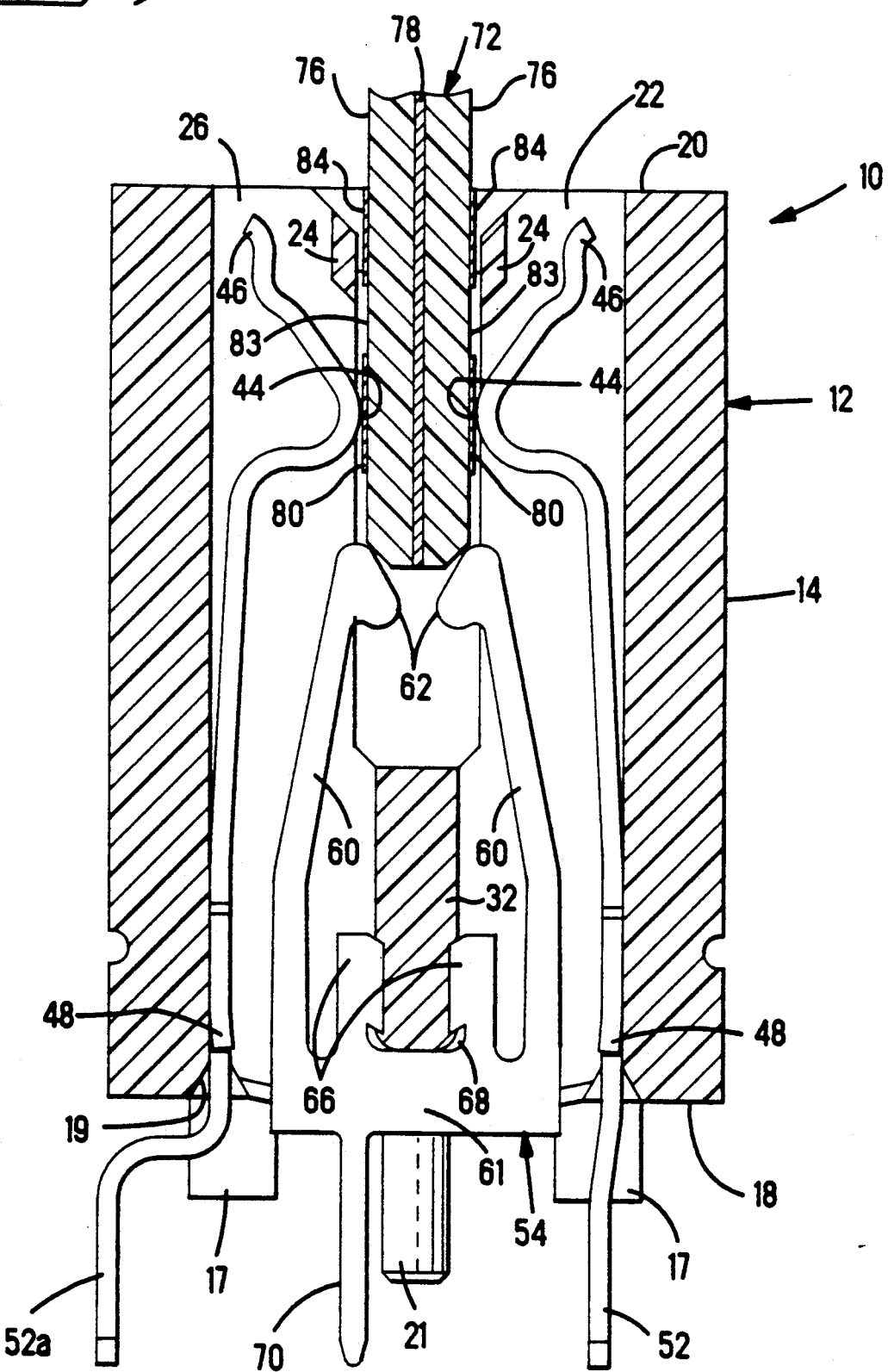
Figure 6:
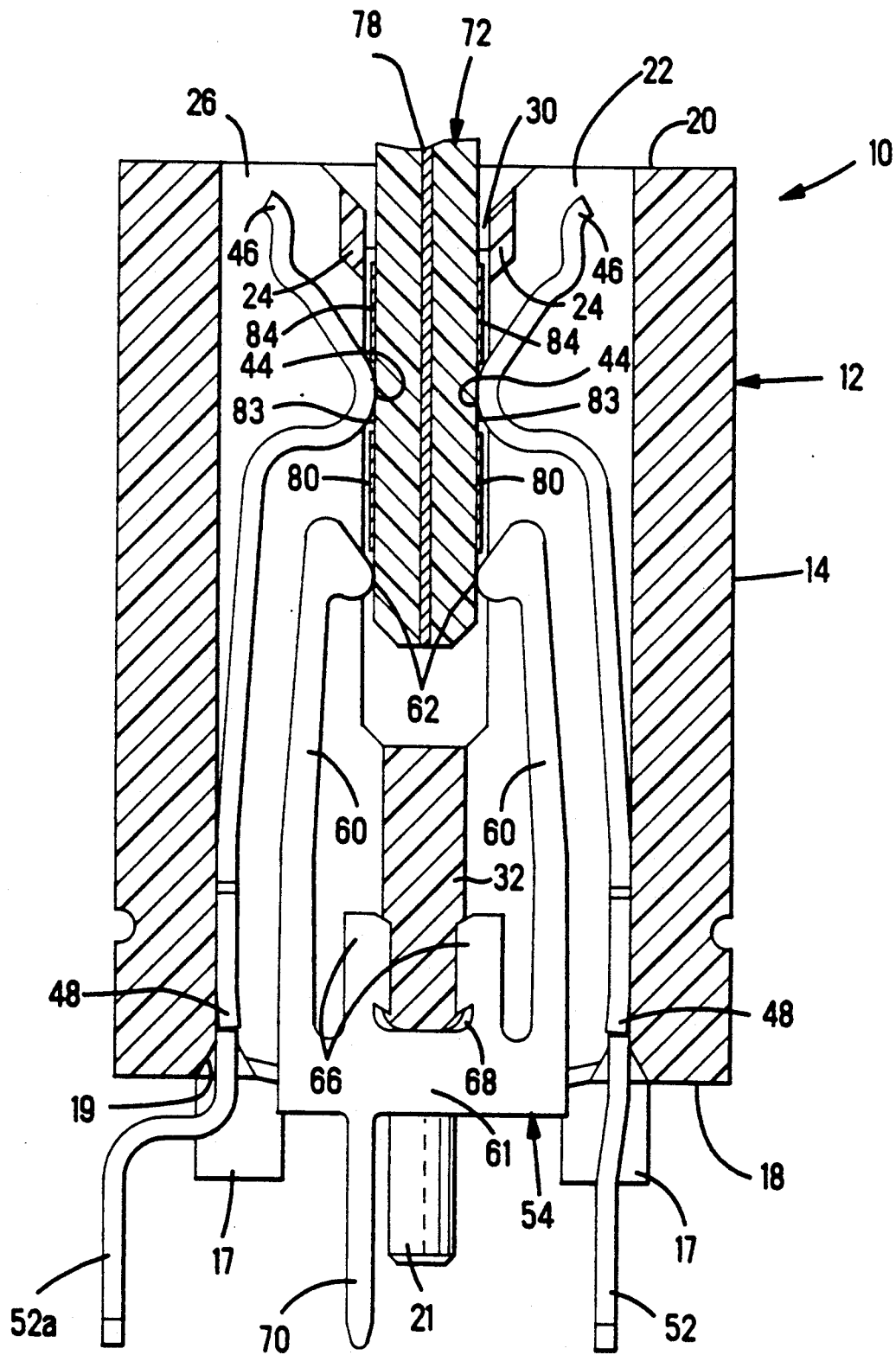
Figure 7:
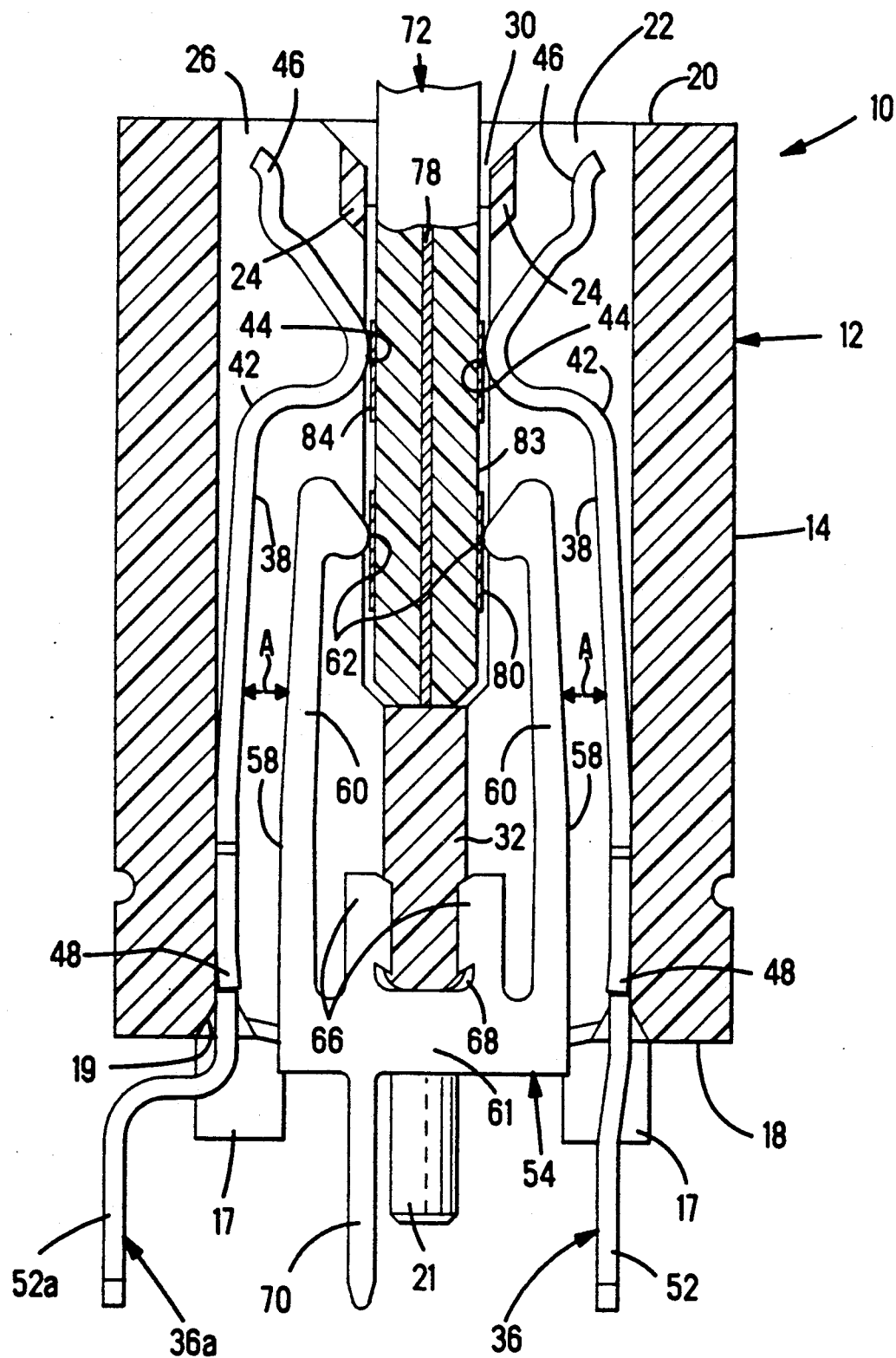

FIGS. 4 through 7 illustrate the sequential process in electrically connecting the respective signal and ground contact members with corresponding signal and ground contact means on card 72 during insertion of the daughter card 72 into connector 10. As is known in the art, card 72 and housing 12 preferably include keying means (not shown) to accurately align the card 72 in card receiving cavity 30. As shown in FIG. 4, the leading edge 74 of card 72 is inserted into card receiving cavity 30 between the signal contact sections 44 of beams 42 causing the beams 42 to deflect outwardly, as card 72 is inserted therebetween. The first contact sections 44 of signal contact member 36, 36a first electrically engage the ground contacts 80 on the board. As shown in FIG. 5, as card 72 is further inserted into the card receiving slot 30, the leading edge 74 of card 72 enters the space between the first contact sections 62 of ground contact member 54 deflecting the corresponding beams 60 outwardly as is shown in FIG. 6. FIG. 6 further illustrates that as the card 72 is moved into card receiving slot 30 the signal and ground contact means 84, 80 on the opposed surfaces 76 of card 72 and the corresponding first signal contact sections 44 and first ground contact sections 62 are sufficiently spaced from each other such that the first contact sections 44 of the signal contact members 36, 36a and the first ground contact section 62 will not simultaneously electrically engage the ground contact means 80 thereby causing a short circuit. FIG. 7 shows the electrical connection of the signal contact sections 44 with corresponding signal means 84 and ground contact sections 62 with ground means 80 on the fully inserted board 72.

In making the electrical connector 10 in accordance with the invention, housing 12 is formed from a dielectric material such as for example polyphenylene sulfide, which is readily available from a number of commercial sources. Other suitable materials, as known in the art, may also be used. The signal contact members are stamped and formed to have a preloaded spring rate designed to provide the desired normal force at the respective contact surface when the card 72 is fully engaged in the connector 10. The signal contact members 36, 36a are loaded from the mounting face 18 of the housing 12 and are inserted so that free ends 44 are secured against upper wall 24 portion. The outwardly extending flanges 48 engage a corresponding flange receiving surface (not shown) within the housing to lock the signal contact members 36, 36a within the housing. To facilitate insertion of contact members, mounting face 18 includes lead in surfaces 19. The ground contact member 54 is also inserted from the mounting face 18 of the connector 10 such that the upwardly extending projections 66 are received on opposite sidewalls of lower wall 32. In the preferred embodiment projections 66 have downwardly extending lances 67 which engage lower housing wall 32 to provide a secure fit within the housing 12. Since the signal contact members 36, 36a press against the outside walls 14 of housing 12 and the ground contact member presses against and grips the center wall or web 32, the resultant reactive stresses created in the contact retention region are directed in lines that extend across the connector width, are independent and are not additive. The connector of the present invention, therefore, distributes internal stresses in a optimal manner.

Signal contact members 36 are preferably made from phosphor bronze or other materials having the desired spring characteristics to provide the sufficient normal force. The ground contact member 54 is stamped from a metal having sufficient spring characteristics to provide a desired normal force at the contact mating face thereof, such as phosphor bronze. In accordance with the invention the materials selected and the geometric configuration of the contact members needs to be such that a sufficient normal force is generated at the respective contact areas to assure electrical reliability of the interconnections. Since no preload is formed in the ground contact member, the ground contact member preferably has a higher spring rate than that of the signal terminal member. In the preferred embodiment the geometrical shape of the outside edge 58 of each ground contact beam 60 is substantially the same as the shape of the adjacent internal major surface 38 of the associated beam 42 of a respective signal contact members 36, 36a to provide a substantially constant spacing A of a selected distance between the signal and ground contact beams and extending essentially along the entire length of the ground contact beams. The shape and spacing between the respective members provides a characteristic impedance to each signal and ground contact group. By maintaining the same characteristic impedance at all contact locations throughout the connector the characteristic impedance of the connector as a whole may be controlled. The connector, therefore, can be "custom designed" within a range of tolerances to control the impedance and to substantially match the impedance of the daughter card and mother board.

FIG. 8 illustrates an alternative embodiment 154 of the ground contact member having a second contact section 170 which is located essentially at the center of the bight portion of the ground contact member 154 and further includes a jog extending upwardly from the plane of the major surface of the contact member 154. This embodiment is designed to be used with the alternative backplane embodiment 186 shown in FIG. 10, wherein the ground through-holes 196 are disposed in a single aligned array. The ground contact members 154 are arranged in pairs such that the second contact sections 170 of the respective pairs lie adjacent each other and enter the same ground through-hole 196 thereby reducing the number of holes required in the backplane or circuit board 186.

It is thought that the card edge connector of the present invention and many of its attendant advantages will be understood from the foregoing description. Changes may be made in the form, construction and arrangement of parts thereof without departing from the spirit and scope of the invention or sacrificing all of its material advantages.

We claim:

1. An electrical connector for use with a circuit card of the type having ground contact means disposed along a leading edge and proximate thereto and signal traces having signal contact means located rearwardly from said ground contact means on each major surface of the circuit card, said connector having a dielectric housing member with a mounting face and an opposed card receiving face, a card receiving cavity extending into said housing from said card receiving face to a card stop means, a plurality of contacts adapted for mating with said card at respective contact locations spaced laterally along said cavity and associated with trace locations along a circuit card received in said cavity, said plurality of contacts including signal contact members arranged in opposed pairs along opposite sides of said card receiving cavity at each said contact location and secured in respective contact receiving passageways thereat in communications with said card receiving cavity, said signal contact members having contact sections for engaging respective opposed signal traces on opposite major surfaces of said card upon card insertion therebetween, said contact sections being defined on free ends of cantilevered beams extending into said cavity to be deflected outwardly by said card upon card insertion whereupon said contact sections become engaged with respective contact sections of signal traces upon full card insertion, said signal contact members having second contact sections at least exposed along the mounting face of the housing and adapted to be mated with corresponding signal contact means of another electrical article, and said connector further including means for grounding said card; said connector being characterized in that:

said ground means of said connector includes a plurality of ground contact members, each said ground contact member being an essentially planar member and including a body section extending from first to second side edges and having a pair of opposed cantilevered beams extending upwardly from said body section proximate said first and second side edges;

said housing and said signal contact members secured therein at each said signal contact location being adapted to permit a said ground contact member to be mounted into said housing at each said signal contact location and between ones of a respective said pair of signal contact members thereat and spaced therefrom, said pair of opposed cantilevered beams extending upwardly into respective ones of said contact receiving passageways and into said card receiving cavity, said beams being deflectable in the plane of said ground contact members by said card upon insertion thereof into said card receiving cavity, said beams including ground contact sections thereon engageable with respective said ground contact means of said card upon full card insertion; and said ground contact members including second ground contact sections at said contact locations, said second ground contact sections at least exposed along the mounting face of said housing and engageable with corresponding ground contacts of said electrical article; whereby said connector has an assured ground connection associated with each signal connection at each location of said signal contact pair and between the signal contact members of the respective said pair.

2. The connector of claim 1 wherein after deflection by said circuit card following insertion thereof into said card receiving cavity, the distance between adjacent portions of each pair of associated said signal and ground contact members is a selected substantially constant distance extending continuously therebetween whereby the impedance component of each said pair is substantially controlled.

3. The connector of claim 1 wherein the width of the ground contact body section is greater than the width of the card received in said card receiving cavity.

4. The connector of claim 1 wherein said ground contact members are mounted on a center rib extending along the length of the housing.

5. The connector of claim 1 wherein said housing includes ground contact receiving recesses below said card stop means including passageways into which said ground contact members are inserted from the bottom of said housing.

* * * * *

UNITED STATES PATENT AND TRADEMARK OFFICE
CERTIFICATE OF CORRECTION

PATENT NO. : 5,026,292

DATED : June 25, 1991

INVENTOR(S) : Charles S. PICKLES etal

It is certified that error appears in the above-identified patent and that said Letters Patent is hereby corrected as shown below:

Claim 1, line 26, Column 7, delete the "communications" and replace with the word --communication--.

Signed and Sealed this

Eighth Day of December, 1992

Attest:

DOUGLAS B. COMER

*Attesting Officer*    *Acting Commissioner of Patents and Trademarks*